US005625322A

United States Patent [19]

Gourgue et al.

[11] Patent Number: 5,625,322
[45] Date of Patent: Apr. 29, 1997

[54] AMPLIFIER BIAS CONTROL DEVICE

[75] Inventors: Frédéric Gourgue; Véronique Soula, both of Paris, France

[73] Assignee: Alcatel N.V., Rijswijk, Netherlands

[21] Appl. No.: 386,630

[22] Filed: Feb. 10, 1995

[30] Foreign Application Priority Data

Feb. 11, 1994 [FR] France .................... 94 01581

[51] Int. Cl.[6] ................ H03G 3/20; H03F 1/26
[52] U.S. Cl. ............................ 330/129; 330/149
[58] Field of Search ...................... 330/127, 129, 330/149, 285, 289; 455/126, 127

[56] References Cited

U.S. PATENT DOCUMENTS

| 5,081,713 | 1/1992 | Miyazaki | 455/126 X |
| 5,119,040 | 6/1992 | Long et al. | 330/149 |

FOREIGN PATENT DOCUMENTS

| 0289807A3 | 11/1988 | European Pat. Off. . |
| 0566406A1 | 10/1993 | European Pat. Off. . |
| 2080248 | 11/1971 | France . |

*Primary Examiner*—Steven Mottola
*Attorney, Agent, or Firm*—Sughrue, Mion, Zinn, Macpeak & Seas

[57] ABSTRACT

A device for controlling the biasing of an amplifier receives an input signal to be amplified and a bias signal and supplies an amplified output signal. The amplifier has at least two separate possible power output values and the amplified output signal is principally in a predetermined frequency band. The device includes a circuit for controlling the biasing of the amplifier which receives linearity control information and generates the bias signal in accordance with the linearity control information so that an actual out-band send level is substantially equal to the required out-band send level. The actual out-band send level is defined as a send level of the amplified output signal outside the predetermined frequency band. The required out-band send level is defined as a predetermined maximal out-band send threshold level for any of the separate possible output power values.

16 Claims, 2 Drawing Sheets

AMPLIFIER BIAS CONTROL DEVICE

BACKGROUND OF THE INVENTION

1. Field of the Invention

The field of the invention is that of amplifiers and in particular microwave power amplifiers with a variable output power and a predetermined frequency band (allocated channel).

2. Description of the Prior Art

Amplifiers of this kind are used in cellular mobile radio systems, for example, including the GSM (Global System for Mobile communications) and TETRA (Trans-European Trunked Radio) systems in which each mobile station is allocated a transmission channel (frequency band).

In each GSM mobile station, for example, an amplifier has to output an amplified signal in the allocated channel, the output power varying in steps of 2 dB over a range of at least 24 dB to allow optimum operation of the system.

In the TETRA system an amplifier has to output an amplified signal in the allocated channel but the output power varies in steps of 5 dB between the maximum power for the mobile station and 15 dBm.

Microwave amplifiers have transfer functions in which the degree of non-linearity is proportional to the output power. This non-linearity generates intermodulation products which broaden the spectrum of the amplified signals.

This broadening of the spectrum compromises correct operation of the radio system in which the amplifiers are used. The amplified signal spills over from the allocated channel (out-band transmission) and represents an interference signal to adjacent channels.

In mobile radio applications the maximal out-band send level (i.e., the maximal interference send level) is specified and enforced to limit interference between channels and guarantee correct operation of the mobile radio system.

There are various ways for limiting out-band output from an amplifier.

A first solution uses the amplifier at much lower than its rated capacity, so that it operates at all times in a linear region (the lower the power level, the less non-linearity is observed). An amplifier rated at 100 W, for example, is biased for this maximum power but is operated at only 10 W. In other words, the amplifier is biased so that linearity constraints are met for the maximal output power and this bias is retained regardless of the actual output power.

This first prior art solution has a major drawback, namely its very low power efficiency (the ratio between the power of the RF output signal and the power drawn from the power supply).

Operating the amplifier at below its rated capacity entails high power consumption and dissipation of a large quantity of energy, and therefore the use of large and heavy heatsinks. In mobile radio systems each mobile station is a portable, battery-powered device incorporating an amplifier. Consequently, high power consumption by the amplifier reduces battery life and the use of large and heavy heatsinks increases the overall size and the weight of the portable device.

A second prior art solution to the problem of limiting out-band output by an amplifier is to add to the amplifier a linearization device to limit broadening of the spectrum. The second solution improves power efficiency but does not optimize it.

It is clear that it is preferable to have good power efficiency combined with good linearity. As these two parameters are mutually contradictory, however, linearity in conformance with out-band send level constraints is always achieved to the detriment of power efficiency.

An object of the invention is to remedy these various drawbacks of the prior art.

To be more precise, a main object of the present invention is to provide an amplifier bias control device which, by adjustment of the bias, obtains the best efficiency/linearity trade-off regardless of the amplifier power output level.

Consequently, one object of the invention is to improve the battery life of portable devices including an amplifier of this kind and either to reduce the overall size and weight of the portable device by enabling a reduction in the size of the energy dissipating heatsinks or to reduce the size of the batteries.

SUMMARY OF THE INVENTION

This main object of the invention and others that emerge below are achieved by a device for controlling the biasing of an amplifier. Specifically, the device receives an input signal to be amplified and a bias signal and supplies an amplified output signal. The amplifier has at least two separate possible power output values. The amplified output signal is principally in a predetermined frequency band.

Specifically, the device comprises a means for controlling the biasing of the amplifier which receive linearity control information and generates the bias signal in accordance with the linearity control information so that an actual out-band send level is substantially equal to the required out-band send level.

The actual out-band send level is defined as a send level of the amplified output signal outside a predetermined frequency band. The required out-band send level is defined as a predetermined maximal out-band send threshold level for any of the separate possible output power values.

The general principle of the invention is therefore to maintain a good efficiency/linearity trade-off regardless of the output power level because the efficiency is optimized and the linearity is always sufficient.

In other words, the invention modifies the biasing of the amplifier so that, regardless of the output power, the out-band send level is maximal within the predetermined out-band send level constraints.

Adjusting the biasing of the amplifier refers to adjusting the biasing of the transistors of the amplifier, i.e., adjusting the quiescent point and the supply voltages of these transistors.

In a first preferred embodiment of the invention, the linearity control information is a required output power value from the at least two separate possible output power values, the control means associating a separate bias signal with each of the at least two separate output power values, with each separate bias signal being predetermined so that, for the output power value with which it is associated, the actual out-band send level is substantially equal to the required out-band send level.

Thus the device of the invention applies a predetermined open loop adjustment to the operating point of the amplifier according to the required output power value. This required output power value can be supplied by a unit external to the device (for example, a microcontroller supervising system operation). The predetermined adjustment of the operating point entails choosing from a plurality of predetermined different bias signals the one which is associated with the required output power value. The association of a different bias signal with each required output power value is established at the design stage and in such a way as to guarantee an actual out-band send level substantially equal to or below the prescribed threshold whilst allowing for any drift due to aging, supply voltage fluctuation, temperature variation, etc.

The device advantageously comprises means for measuring at least one external parameter. The control means also receives the at least one external parameter and generates a bias signal allowing for at least one external parameter. The at least one external parameter is preferably selected from the group comprising:

a supply voltage of the amplifier, and a temperature of the amplifier.

In a second preferred embodiment of the invention, the device comprises:

copying means for copying the amplified output signal and supplying a copied signal;

analyzer means receiving the copied signal and supplying an actual out-band send level determined from the copied signal;

comparator means for comparing the actual out-band send level with the required out-band send level and supplying a result constituting linearity control information.

The device of the invention applies adaptive open loop adjustment to the operating point of the amplifier in accordance with the actual out-band send level, i.e., in accordance with the linearity of the amplifier. The actual out-band send level is determined by analyzing the amplified output signal. The adaptive adjustment of the operating point entails comparing the actual out-band send level with a required out-band send level and varying the bias of the amplifier in accordance with the result of this comparison. If the actual out-band send level is greater than the required out-band send level the bias is increased (to increase the maximal output power) in order to reduce the actual out-band send levels. In other words, linearity is enhanced with a detriment of efficiency. In the contrary case, the bias (and therefore the maximal output power) are reduced in order to reduce the dissipated power. In other words, efficiency is enhanced with a detriment of linearity since the actual out-band level is increased.

The device advantageously comprises a converter means for converting the copied signal and supplying a converted signal to the analyzer means. The converter means are advantageously selected as a baseband converter means or an intermediate frequency converter means.

There are two possible situations that may arise depending on whether the amplifier receives only a desired signal to be amplified or a desired signal to be amplified alternating with a test signal.

If the amplifier is of the type receiving only a desired signal to be amplified, the device is advantageously used when the amplifier receives the desired signal to be amplified.

In this first case, the analyzer means preferably comprises:

sampling means for sampling the copied signal and supplying a sampled signal;

analog/digital converter means for receiving the sampled signal and delivering a digital signal; and digital signal processor means for receiving the digital signal and supplying the actual out-band send level.

The digital signal processor means preferably does the following:

performs spectrum analysis to determine a power spectrum of the digital signal, associating a power with each frequency of the spectrum, and generates the actual out-band send level in the form of a cumulative total of powers associated with predetermined frequencies outside the predetermined frequency band.

the required out-band send level is preferably defined as a predetermined maximal cumulative power level.

Accordingly, if the amplifier receives only a desired signal to be amplified, the actual interference send level is estimated directly by analyzing the spectrum of the amplifier output signal.

If the amplifier receives either a desired signal to be amplified or a test signal, the device advantageously comprises means for generating at least one of the signals selected from the group comprising:

a test signal and a desired signal to be amplified;

the device is utilized only when the amplifier receives the test signal.

The test signal preferably comprises at least two sinusoidal signals to be amplified, the amplified output signal preferably including at least two first sinusoidal signals with the same frequencies as the at least two sinusoidal signals to be amplified and second sinusoidal signals at frequencies different from those of the at least two sinusoidal signals to be amplified, the second sinusoidal signals preferably being intermodulation products.

The actual out-band send level determined by the analyzer means is preferably a power level of the second sinusoidal signals.

Accordingly, the actual interference send level is estimated indirectly by sending a test signal and determining the level of the resulting intermodulation products.

The test signal advantageously comprises two sinusoidal signals to be amplified of substantially the same amplitude and at similar frequencies in the predetermined frequency band.

The second sinusoidal signals are advantageously odd order intermodulation products of the third or greater order.

The analyzer means preferably comprise narrowband analog filters centered on the frequencies of the second sinusoidal signals and preferably generates the actual out-band send level in the form of a set of actual coefficients, each of the actual coefficients corresponding to an output power of one of the analog filters.

The required out-band send level is preferably defined as a set of predetermined maximal coefficients.

In one embodiment of the invention the analyzer means comprises:

sampling means for sampling the copied signal and supplying a sampled signal;

analog/digital converter means for receiving the sampled signal and supplying a digital signal; and digital signal processor means for receiving the digital signal and supplying the actual out-band send level.

The digital signal processor means does the following:

performs spectrum analysis to determine a power spectrum of the digital signal and associating a power with each frequency of the spectrum, and generates the actual out-band send level in the form of a set of actual coefficients that each represent a power of one of the second sinusoidal signals.

The required out-band send level is defined as a set of predetermined maximal coefficients.

In a preferred embodiment of the invention the device comprises means for measuring at least one external parameter. The control means receives at least one external parameter. The bias signal is also conditioned by the at least one external parameter.

The at least one external parameter is advantageously selected from the group comprising:

a supply voltage of the amplifier;

a temperature of the amplifier; and a required output power value selected from at least two separate possible output power values.

In an advantageous embodiment of the invention the amplifier is associated with a linearizer device including a feedback loop. The bias control device uses at least part of the feedback loop. This can reduce the cost of the device of the invention.

The feedback loop advantageously comprises at least some means selected from the group comprising:

amplified output signal copying means;

copied signal converter means;

copied signal sampling means; and sampled signal analog/digital converter means.

Other features and advantages of the invention will emerge from a reading of the following description of various preferred embodiments of the invention given by way of a non-limiting illustrative example only and with reference to the appended drawings.

DETAILED DESCRIPTION OF THE PREFERRED EMBODIMENTS

Figure 1:
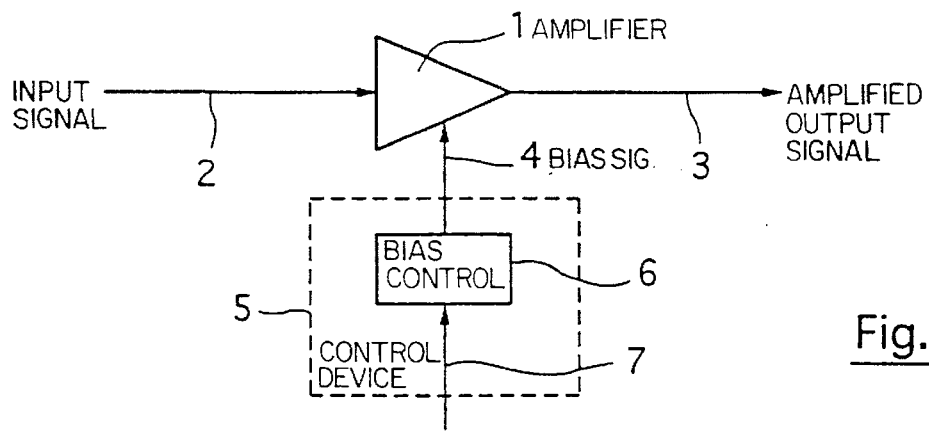
FIG. 1 is a block diagram of a system comprising an amplifier and device of the invention.

The invention concerns a device for controlling the bias of an amplifier. FIG. 1 is a block diagram of a system of this kind. The amplifier 1 receives an input signal 2 to be amplified and supplies an amplified output signal 3. The amplifier 1 also receives a bias signal 4 which affects its operating point. The bias signal 4 adjusts the biasing of the transistors of the amplifier 1 and in particular the quiescent point and the supply voltages of those transistors.

The amplifier 1 has a variable output power and its output is in a predetermined frequency band. For example, it is an amplifier of the type used in each mobile station of a GSM or TETRA cellular mobile radio system. An amplifier of this kind must output in an allocated channel and have an output power that can vary:

(1) in steps of 2 dB over a range of at least 24 dB in the case of the GSM system;

(2) in steps of 5 dB between the maximal rated power and 15 dB in the case of the TETRA system.

The device 5 of the invention supplies the bias signal 4 to the amplifier 1. To be more precise, the device 5 of the invention includes means 6 for controlling the biasing of the amplifier 1, which generates the bias signal 4 in accordance with linearity control information 7 that is received.

The bias signal 4 is conditioned by the linearity control information 7 and operates on the amplifier 1 to modify the actual out-band send level so that it is substantially equal to the required out-band send level.

An actual or required out-band send level is defined as an interference send level in the channels adjacent to the allocated channel, i.e., in other words, as a send level outside the predetermined frequency band normally transmitted by the amplifier 1.

The actual out-band send level is the out-band send level that is actually present at the output of the amplifier. The required out-band send level is the level that the actual out-band send level is required to assume. This required out-band send level is a predetermined maximal threshold level, which is usually low enough to limit significantly the interference between adjacent channels.

Figure 2:
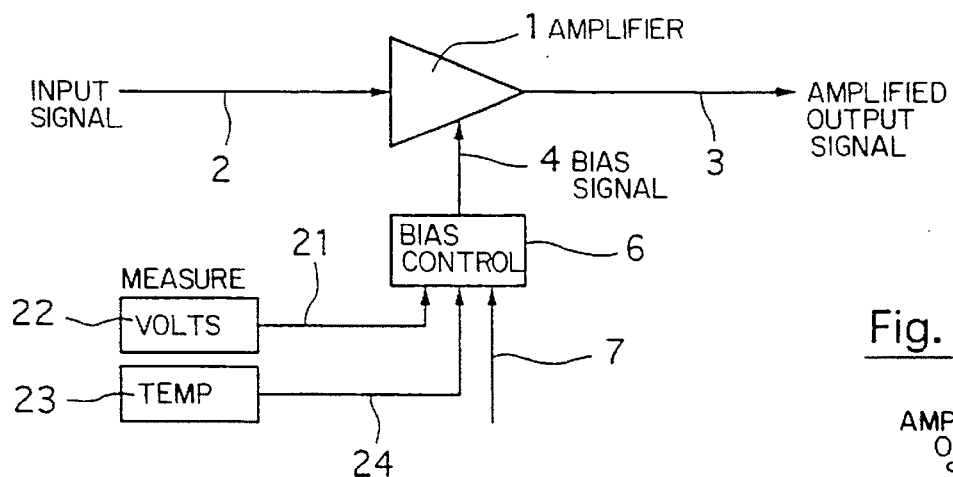
FIGS. 2, 3 and 4 are simplified block diagrams of respective embodiments of a device of the invention.

FIG. 2 shows a first embodiment of an amplifier bias control device of the invention.

In this first embodiment of the invention the linearity control information 7 received by the control means 6 is a required output power value. This required output power value 7 is supplied by a microcontroller (not shown) supervising the operation of the system comprising the amplifier and the device of the invention, for example, and is one possible output power value. These values are spaced by 2 dB across a range of 24 dB in the case of the GSM system or in steps of 5 dB between the maximal power and 15 dB in the case of the TETRA system.

The control means 6 supplies a bias signal 4 conditioned by the required output power value 7. To this end the control means 6 associates a separate bias signal 4 with each possible output value. The various bias signals are predetermined at the design stage so 30 that, for a required output power value, the associated bias signal operates on the amplifier to modify the actual out-band send level to make it substantially equal to the required out-band send level.

When the various bias signals are predetermined, it is possible to allow for drift due to aging, supply voltage fluctuation and temperature variation, for example.

The control device can also include means for measuring one or more external parameters to be taken into account by the control means 6, over and above the linearity control information, in predetermining the various bias signals. Accordingly, in FIG. 2, the control device includes means 22 for measuring the supply voltage 21 of the amplifier 1 and means 23 for measuring the temperature 24 of the amplifier 1.

The first embodiment of the device of the invention, described with reference to FIG. 2, therefore controls the operating point of the amplifier 1 in a predetermined manner conditioned by the required output power and possibly by the supply voltage and the temperature.

In the second and third embodiments of the device of the invention, as described below with reference to FIGS. 3 and 4, respectively, the operating point of the amplifier 1 is adjusted in an adaptive manner and in a closed loop after the linearity of the amplifier is assessed by analyzing the amplified output signal. In the second and third embodiments the linearity control information 7 received by the control means 6 is obtained by comparing the actual out-band send level and the required out-band send level.

In these second and third embodiments, the device of the invention comprises:

(1) means 31 for copying the amplified output signal 3, and supplying a copied signal 32;

(2) analyzer means 33, 33' for receiving the copied signal 32 and supplying an actual out-band send level signal 34, 34';

(3) comparator means 35 for comparing the actual out-band send level 34, 34' with a required out-band send level 36, 36' and thereby supplying the linearity control information 7; and (4) control means 6 for controlling the bias of the amplifier 1 by receiving the linearity control information 7 and generating the bias signal 4.

The bias is therefore adjusted in the following manner: the analyzer means 33, 33' estimates the actual out-band send-level 34, 34' and then the comparator means 35 compares this actual out-band send level 34, 34' to a required out-band send level 36, 36' and finally the control means 6 receives the results 7 of this comparison and uses it to calculate the bias signal 4. Regarding this bias signal 4:

(1) If the actual out-band send level is greater than the required out-band send level, the bias is modified to reduce the actual out-band send level. Here, linearity is improved but efficiency is reduced.

(2) If the actual out-band send level is less than the required out-band send level, the bias is modified to increase the actual out-band send level. Here, efficiency is improved but linearity is worsened.

The device may include baseband or immediate frequency converter means 37 for converting the copied signal 32. In this case the analyzer means 33, 33' receives a converted signal 38.

Likewise, the control means 6 can take into account, in addition to the linearity control information, external parameters such as:

(1) the supply voltage 39 of the amplifier (supplied by appropriate measuring means 310);

(2) the temperature 311 of the amplifier (supplied by appropriate measuring means 312); and (3) a required output power value 313 (supplied by means that are not shown).

In the second embodiment (FIG. 3) the amplifier 1 receives only a desired signal 2 that is to be amplified. The inventive device is used when the amplifier receives this desired signal 2 that is to be amplified.

Figure 5:
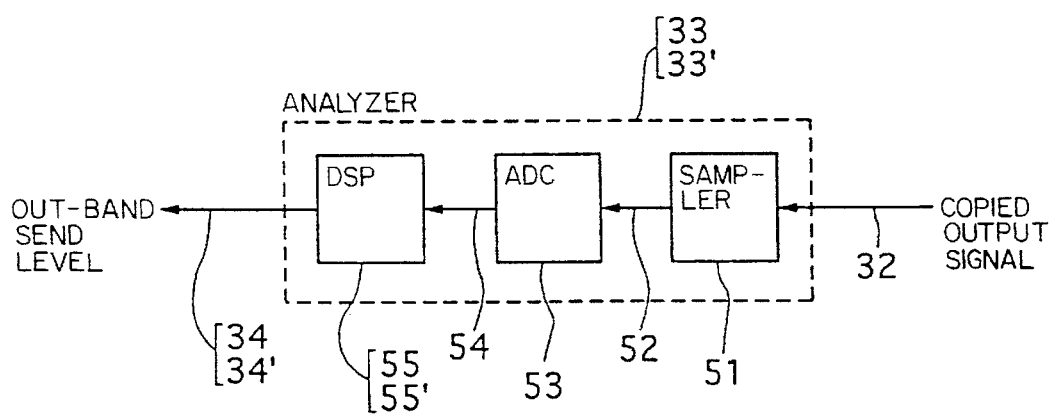
FIG. 5 is a simplified block diagram of a preferred embodiment of the analyzer means shown in FIGS. 3 and 4.

As shown in FIG. 5, the analyzer means 33 comprises, for example:

(1) sampling means 51 for sampling the copied signal 32 (or the converted signal 38), and for supplying a sampled signal 52 therefrom;

(2) analog/digital converter means 53 for receiving the sampled signal 52 and supplying a digital signal 54 therefrom; and (3) digital signal processor means 55 for receiving the digital signal 54 and supplying the actual out-band send level therefrom 34.

Accordingly, the analyzer means 33 estimates the actual out-band send level 34 directly from the copied signal 32 or the converted signal 38. To be more precise, the digital signal processor means 55 (part of the analyzer means 33) carries out spectrum analysis of the digital signal 54 using a discrete Fourier transform, for example, and then generates the actual out-band send level using the result of the spectrum analysis. The spectrum analysis determines a power spectrum of the digital signal 54 which associates a power with each frequency of the spectrum. Generation of the actual out-band send level 34 entails cumulative totalling of the powers associated with predetermined frequencies outside the band of frequencies allocated to the amplifier 1. The required out-band send level 36 is then a maximal predetermined cumulative power level.

In the third embodiment (FIG. 4), the amplifier 1 receives an input signal 2 to be amplified comprising either a desired signal that is to be amplified or a test signal, and is activated only when it receives the test signal.

Figure 3:
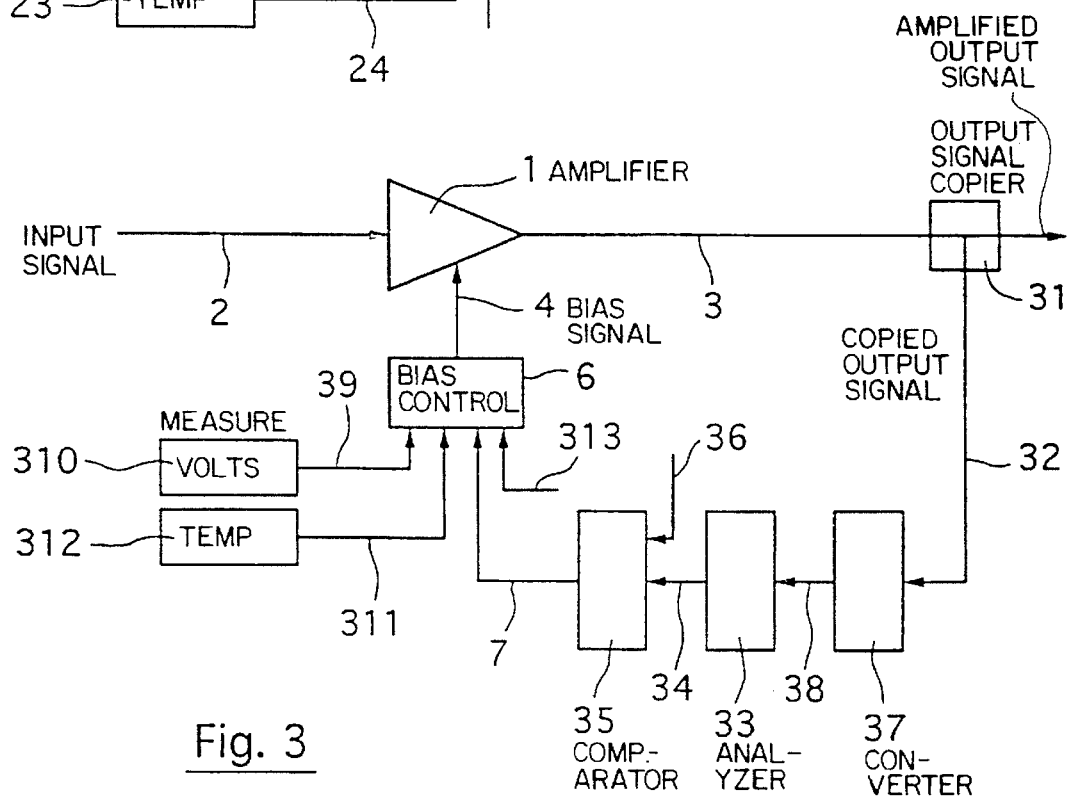
Figure 4:
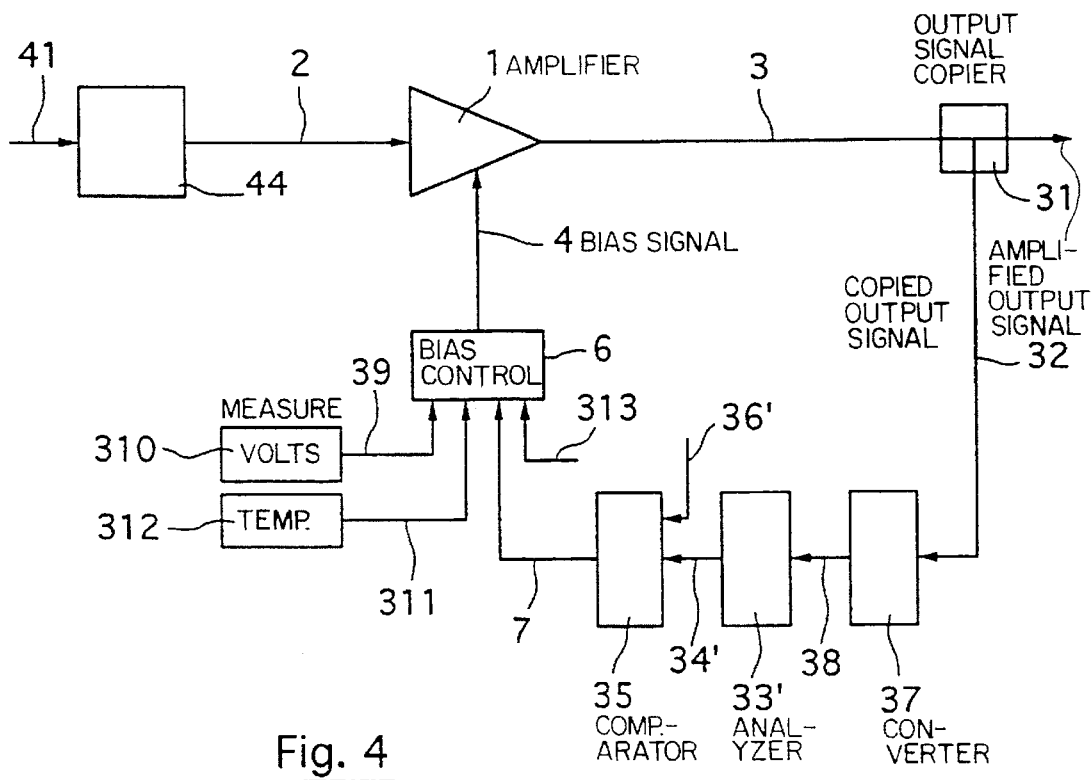

As shown in FIG. 4, in this third embodiment the device comprises an additional unit as compared to the second embodiment shown in FIG. 3, namely means 44 for generating:

either (1) a test signal if the biasing of the amplifier has to be adjusted, or (2) a desired signal to be amplified if the means 44 receive a stream of desired information to be amplified.

The test signal (also referred to as a multi-tone signal) comprises a plurality of sinusoidal signals, for example, and the analyzer means 33' estimates the actual out-band send level 34' indirectly from the copied signal 32 (or the converted signal 38) corresponding to the amplified test signal.

If a plurality of sinusoids are amplified simultaneously by a non-linear component, then there is obtained as output, in addition to the amplified sinusoids present at the input, unwanted signals known as intermodulation products (see chapter I.10 in "Telecommunications spatiales: I bases theoriques", prepared by the CNES and the CNET and published by Editions MASSON in 1982).

In this embodiment, the actual out-band send level 34' is therefore defined as the level of the intermodulation products, for example the intermodulation products of the third order (or any odd order greater than three).

The test signal can therefore comprise two sinusoids with the same amplitude and similar frequencies $f_1$, $f_2$ ($f_1 < f_2$) in the operating band of the amplifier. The third order intermodulation products are in the desired band having the frequencies $(2f_1 - f_2)$ and $(2f_2 - f_1)$.

The analysis carried out by the analyzer 33' determines a set of actual coefficients (in this context "actual" as compared to "desired") where each actual coefficient corresponds to the power of one of the intermodulation products. This set of actual coefficients, which represents the actual out-band send level 34' and the required out-band send level 36', is then a set of predetermined maximal coefficients representing an increase in each of the actual coefficients. The predetermined maximal coefficients can be determined at the design stage by simulation or by measurement.

This analysis can be implemented in the analog domain. In this case, the analyzer means 33' comprises narrowband analog filters centered on the frequencies of the intermodulation products to be measured. There are then as many actual coefficients as analog filter outputs.

Alternatively, the analysis can be carried out in the digital domain. In this case the analyzer means 33' are of the type shown in FIG. 5 and include sampling means 51, analog/digital converter means 53 and digital signal processor means 55'.

The digital signal processor means 55' differ from those 55 described previously in that, after determining a power spectrum of the digital signal, they generate the actual out-band send level in the form of a set of actual coefficients each representing the power of one of the intermodulation products to be measured.

Many algorithms can be used to estimate the level of the intermodulation products. If the number and frequencies of the intermodulation products are known, one powerful method that can be used is an identification method based on an ARMA model adapted to the number of modulation products present (i.e., the number of sinusoids present); see chapter 6 in the second edition of "Optimum Signal Processing: An introduction", S. F. Orfanidis, McGraw Hill Book Company, 1990.

Note that when the amplifier is associated with a linearizer device including a feedback loop, some components of the feedback loop can be used by the device of the invention. The components common to the linearizer device and the device of the invention are, for example:

(1) the means 31 for copying the amplified output signal 3;

(2) the baseband or intermediate frequency converter means 37 for converting the copied signal 32;

(3) the sampling means 51 for sampling the copied signal 32 (or the converted signal 38); and (4) the analog/digital converter means 53 for converting the sampled signal 52.

There is claimed:

1. Device for controlling the biasing of an amplifier comprising:

amplifier means which receives both an input signal to be amplified and a bias signal, said amplifier means supplying an output signal therefrom that is principally in a predetermined frequency band and comprises at least two separate power output values;

bias control means for controlling the biasing of said amplifier, said bias control means receiving a linearity control information and transmitting said bias signal therefrom such that an actual out-band send level substantially equals a required out-band send level, wherein said actual out-band send level is defined as a send level of said amplified output signal outside said predetermined frequency band, and wherein said required out-band send level is defined as a predetermined maximal out-band send threshold level for any of said separate possible output power values.

2. Device according to claim 1 wherein said linearity control information is a required output power value selected from said at least two separate possible output power values, wherein said bias control means associates a separate bias signal with each of said at least two separate possible power output values, each separate bias signal being predetermined so that, for the associated output power value, the actual out-band send level is substantially equal to the required out-band send level.

3. Device according to claim 1 further comprising:

copying means for copying said amplified output signal and supplying a copied signal therefrom;

analyzer means receiving said copied signal and supplying said actual out-band send level determined from said copied signal;

comparator means for comparing said actual out-band send level with said required out-band send level and supplying a result constituting said linearity control information.

4. Device according to claim 3 further comprising:

converter means for converting said copied signal and supplying a converted signal to said analyzer means, said converter means being selected from the group comprising baseband converter means and intermediate frequency converter means.

5. Device according to claim 3, wherein said amplifier is of the type receiving only a desired signal to be amplified, and wherein said device is activated when said amplifier receives said desired signal to be amplified.

6. Device according to claim 5 wherein said analyzer means further comprises:

sampling means for sampling said copied signal and supplying a sampled signal therefrom;

analog/digital converter means for receiving said sampled signal and supplying a digital signal therefrom; and digital signal processor means for receiving said digital signal and supplying said actual out-band send level therefrom, wherein said digital signal processor means performs spectrum analysis to determine a power spectrum of said digital signal, associating a power with each frequency of said spectrum, and said digital signal processor generates said actual out-band send level in the form of a cumulative total of powers associated with predetermined frequencies outside said predetermined frequency band, wherein said required out-band send level is defined as a predetermined maximal cumulative power level.

7. Device according to claim 3 further comprising:

signal generating means for generating at least one signal selected from the group comprising a test signal and a desired signal that is to be amplified and activated only when said amplifier receives said test signal.

8. Device according to claim 7 wherein said test signal comprises at least two sinusoidal signals to be amplified, wherein said amplified output signal comprises at least two first sinusoidal signals with the same frequencies as said at least two sinusoidal signals to be amplified and second sinusoidal signals with frequencies different from those of said at least two sinusoidal signals to be amplified, said second sinusoidal signals being intermodulation products, and wherein said actual out-band send level determined by said analyzer means is a level of said second sinusoidal signals.

9. Device according to claim 8 wherein said test signal comprises two sinusoidal signals to be amplified of substantially the same amplitude and at similar frequencies in said predetermined frequency band, and said second sinusoidal signals are intermodulation products of an odd order at least equal to three.

10. Device according to claim 8 wherein said analyzer means further comprises narrowband analog filters centered on the frequencies of said second sinusoidal signals and generating said actual out-band send level in the form of a set of actual coefficients, each of said actual coefficients representing an output power of one of said analog filters, and said required out-band send level is defined as a set of predetermined maximal coefficients.

11. Device according to claim 8 wherein said analyzer means further comprises:

sampling means for sampling said copied signal and supplying a sampled signal therefrom;

analog/digital converter means for receiving said sampled signal and supplying a digital signal therefrom; and digital signal processor means for receiving said digital signal and supplying said actual out-band send level therefrom, wherein said digital signal processor means performs spectrum analysis to determine a power spectrum of said digital signal, associating a power with each frequency of said spectrum, and generates said actual out-band send level in the form of a set of actual coefficients each representing a power of one of said second sinusoidal signals, wherein said required out-band send level is defined as a set of predetermined maximal coefficients.

12. Device according to claim 1 further comprising:

measuring means for measuring at least one external parameter wherein said bias control means also receives said at least one external parameter, said bias signal being conditioned by said at least one external parameter.

13. Device according to claim 12 wherein said at least one external parameter is selected from the group comprising: a supply voltage of said amplifier and a temperature of said amplifier.

14. Device according to claim 12 wherein said at least one external parameter is selected from the group comprising:
- a supply voltage of said amplifier;
- a temperature of said amplifier; and
- a required output power value selected from said at least two separate possible output power values.

15. Device according to claim 1 wherein said amplifier is associated with a linearizer device including a feedback loop and wherein said bias control device uses at least part of said feedback loop.

16. Device according to claim 15, wherein said feedback loop comprises one or more of the following components:
- said amplified output signal copying means;
- said copied signal converter means;
- said copied signal sampling means; and
- said sampled signal analog/digital converter means.

* * * * *